United States Patent
Beer

(10) Patent No.: US 7,159,156 B2
(45) Date of Patent: Jan. 2, 2007

(54) MEMORY CHIP WITH TEST LOGIC TAKING INTO CONSIDERATION THE ADDRESS OF A REDUNDANT WORD LINE AND METHOD FOR TESTING A MEMORY CHIP

(75) Inventor: Peter Beer, Tutzing (DE)

(73) Assignee: Infineon Technologies AG, Munich (DE)

(*) Notice: Subject to any disclaimer, the term of this patent is extended or adjusted under 35 U.S.C. 154(b) by 577 days.

(21) Appl. No.: 10/610,186

(22) Filed: Jun. 30, 2003

(65) Prior Publication Data

US 2004/0001375 A1    Jan. 1, 2004

(30) Foreign Application Priority Data

Jun. 28, 2002   (DE)   ............... 102 29 164

(51) Int. Cl.
*G11C 29/00*   (2006.01)
*G11C 7/00*    (2006.01)

(52) U.S. Cl. ...................... 714/710; 365/201
(58) Field of Classification Search ............... 714/718, 714/710, 711; 365/201
See application file for complete search history.

(56) References Cited

U.S. PATENT DOCUMENTS 6,182,257 B1   1/2001   Gillingham 6,421,284 B1 *  7/2002  Sakata ..................... 365/200

FOREIGN PATENT DOCUMENTS

EP    1 150 211 A2    10/2001

* cited by examiner

*Primary Examiner*—Cynthia Britt
(74) *Attorney, Agent, or Firm*—Laurence A. Greenberg; Werner H. Stemer; Ralph E. Locher

(57) ABSTRACT

A memory chip includes an on-chip data generator, a scrambler unit for checking the correct operability of the memory cells, a repair unit, and redundant word lines that, in the case of a memory cell recognized as defective, are used instead of the word line regularly activated. The scrambler unit is connected to the repair unit and, thus, receives from the repair unit information on whether the redundant word line replacing a defective word line drives transistors of memory cells that can be connected to true bit lines or to complementary bit lines. As such, the scrambler unit can take the information as to whether a true bit line or a complementary bit line is driven through the spare word line into consideration when performing the test procedure. This provides for a more efficient performance of the test procedure. Also provided is a method for testing memory cells.

2 Claims, 3 Drawing Sheets

MEMORY CHIP WITH TEST LOGIC TAKING INTO CONSIDERATION THE ADDRESS OF A REDUNDANT WORD LINE AND METHOD FOR TESTING A MEMORY CHIP

BACKGROUND OF THE INVENTION

Field of the Invention

The invention relates to a memory chip with memory cells with a data generator and a test logic for the writing-in and reading-out of test data in the memory cells and to a method for testing memory cells of a memory chip by a test logic for the writing-in and reading-out of test data into the memory cells.

The size of the memory chips, particularly of DRAM memories, continues to increase and, at the same time, the size of a memory cell continues to decrease. Both tendencies lead to an increase in the complexity of the manufacturing method for the memory chip. This requires a continuous increase in the quality of the manufacturing processes. Despite intensive efforts, it is unavoidable that, with the multiplicity of memory cells exhibited by a memory chip, individual memory cells are defective. After the memory chip has been manufactured, the defective memory cells are sought through corresponding test methods and replaced by redundant memory cells by readdressing. Each memory chip has a fixed number of redundant memory cells that are available for repairing defective memory cells. The defective memory cells are repaired, for example, by providing a readdressing logic that, when an address of a defective memory cell is applied, automatically diverts the memory access to the functioning memory cell specified for the defective memory cell. This makes it possible to repair the defective memory cell without having to change the addressing to be applied from the outside.

However, to ensure a high operability of the memory chip, it is required that the redundant memory cells used for replacing the defective memory cells are also checked for correct operability. For such a purpose, a data generator is provided on a memory chip, by which data specified through test logic are also read into the redundant memory cells used for replacing faulty memory cells. After that, the data read in are read out again and are compared with the data read in by a comparison device. This makes it possible to find out whether or not the data read into the redundant memory cells have been correctly read in and correctly read out again.

When defective memory cells are repaired, redundant word lines are, usually, used that are either connected to true bit lines or complementary bit lines. A true bit line and a complementary bit line form a pair of bit lines, the voltage potentials of which are taken into consideration by a comparison device during the evaluation of the data item of a memory cell that is connected either to the true bit line or to the complementary bit line. In such a configuration, an amplifier circuit outputs a logical one where the voltage level of the true bit line is greater than the voltage level of the complementary bit line. Correspondingly, the amplifier circuit outputs a logical zero when the voltage level of the true bit line is lower than the voltage level of the complementary bit line. This type of evaluation makes it necessary that a logical one is written as a physical high level into a memory cell that is connected to a true bit line. In contrast, a logical one that is written into a memory cell that is connected to a complementary bit line is written in with a physical low level. The physical levels and charge states for storing a logical zero also correspondingly differ between a memory cell that is connected to a true bit line and a memory cell that is connected to a complementary bit line.

To test a memory cell, it is of importance to know the physical voltage level in the cell. When testing the retention, for example, the state at which the memory cell exhibits a high level is critical, in particular. A high level means that a higher voltage potential than in the environment is deposited in the memory cell. The higher voltage potential is clearly more sensitive to interference influences such as, e.g., a leaking-away of the charges. For such a reason, a reliable check of the memory cells and, particularly, of the redundant memory cells, requires that each memory cell is checked at least for a physical high level. The test logic configurations hitherto used are connected to the address register of the word lines and recognize from the address of the word line whether the word line is a word line that is connected to true bit lines or to complementary bit lines. Thus, this information can be taken into consideration when testing the word lines for a reduction in the test effort so that at least all memory cells are tested for a physical high level.

If, however, a repair process replaces a word line by a redundant word line, this information is lost. The result is that, in the case of memory chips in which a word line has been replaced by a redundant word line, the tests of the memory cells are tested with a first test pattern of logical data bits and, then, with a second test pattern of logical data bits, the first and the second data pattern exhibiting complementary values for a memory cell. It is, thus, ensured that each memory cell, and, therefore, also each redundant repaired memory cell has always been tested at least once with a physical high level.

SUMMARY OF THE INVENTION

It is accordingly an object of the invention to provide a memory chip with test logic taking into consideration the address of a redundant word line and method for testing the memory chip that overcome the hereinafore-mentioned disadvantages of the heretofore-known devices and methods of this general type and that makes possible a better and shorter test of the repaired cell array.

With the foregoing and other objects in view, there is provided, in accordance with the invention, a memory chip, including memory cells having word lines, spare word lines, and bit lines, a data generator, a test logic connected to the data generator and to the memory cells for writing test data into and reading test data out from the memory cells, a first address register for supplying a first address for a selection of one of the word lines, a second address register for supplying a second address for a selection of one of the bit lines, a first selection decoder connected to the first address register, the first selection decoder activating a word line dependent upon the first address provided by the first address register, a plurality of switches having control inputs connected to the word lines, each of the switches being connected between a respective one of the memory cells and one of the bit lines, the switches being connected to the word line being switched to conduct with an activation of the word line, respective sets of two of the bit lines being combined to form one bit line pair, a first of the bit line pair being a true bit line and a second of the bit line pair being a complementary bit line, amplifier circuits, a respective one of the amplifier circuits being connected to a respective one of the bit line pairs, a second selection decoder connecting the test logic to the amplifier circuits, the second selection decoder being connected to the second address register for selecting the bit line pair, the test logic being connected to the first selection decoder, the test logic writing into one of the memory cells connected to a complementary one of the bit lines a logical data item having a different physical value than a data item written into another of the memory cells connected to the true bit line, a repair unit being connected to the test logic and having an address register storing addresses therein at least of the spare word lines, the repair unit being connected to the first selection decoder and diverting, through a readdressing of an access of the first selection decoder to a defective one of the word lines, to one of the addresses, stored in the address register, of a spare one of the spare word lines, and the test logic taking into consideration an address of the spare word line during the writing and reading of the test data in the presence of a readdressing to one of the spare word lines, the address of the spare word line having information regarding connection of the spare word line to one of the true bit line and the complementary bit line.

With the objects of the invention in view, there is also provided a method for testing memory cells of a memory chip having word lines, spare word lines, and bit lines, including the steps of providing a test logic for writing in test data to the memory cells and reading out test data from the memory cells with a first address register supplying a first address for selecting a word line, supplying a second address for selecting a bit line with a second address register, connecting a first selection decoder to the first address register, connecting the test logic to the first selection decoder, activating a word line through the first selection decoder dependent upon the first address of the first address register, connecting a word line to at least one control input of a plurality of switches, connecting a switch between each of the memory cells and each of the bit lines, switching at least one switch connected to a word line to conduct with an activation of the word line, combining two types of the bit lines to form respective bit line pairs, connecting a respective bit line pair to a respective amplifier circuit, a first bit line of the bit line pair being a true bit line and a second bit line of the bit line pair being a complementary bit line, during the reading out of a data item, comparing potentials of the true bit line and the complementary bit line of a bit line pair with the amplifier circuit, recognizing a logical one with the amplifier circuit when a potential of the true bit line is greater than a potential of the complementary bit line and recognizing a logical zero with the amplifier circuit when the potential of the true bit line is less than the potential of the complementary bit line, connecting the test logic to the amplifier circuits through a second selection decoder, selecting an amplifier circuit by connecting the second selection decoder to the second address register, with the test logic, writing into a memory cell connected to a complementary bit line a data item having a different physical value than a data item written into a memory cell connected to a true bit line, providing a repair unit with an address register for storing addresses and connecting the repair unit to the test logic, readdressing an access of the first selection decoder to a defective word line by the repair unit diverting the access to an address of a spare word line deposited in the address register, taking into consideration the address of the spare word line with the test logic in the presence of a readdressing to a spare word line, the address of the spare word line exhibiting information on whether the spare word line is a true bit line or a complementary bit line, only writing data corresponding to a high level into the memory cells with the test logic, and recognizing a correct operability of the memory cells by reading out the memory cells again and comparing the data read out with the data written therein.

A significant advantage of the memory chip according to the invention lies in supplying the repair unit with an information item that provides information on whether the redundant word line is connected to true bit lines or complementary bit lines. This makes it possible to take the information as to whether this is a true bit line or a complementary bit line into consideration during a test of the memory cells. As such, it is sufficient if each memory cell is checked for the critical state, i.e., for a physical high level. Because the write logic receives information about whether the memory cell to be tested is connected to a true bit line or a complementary bit line, the logical data item can be selected by which a physical high level is written into the memory cell.

An important advantage of the method according to the invention lies in, during a test of the repaired cell array, also writing to the redundant memory cells with the correct physical level by the test logic and taking into consideration the information whether the redundant memory cell is connected to true bit line or a complementary bit line during the performance of the test method. As such, the test method required for checking the memory cells is halved from the point of view of time consumed. There is no test with complementary data.

Other features that are considered as characteristic for the invention are set forth in the appended claims.

Although the invention is illustrated and described herein as embodied in a memory chip with test logic taking into consideration the address of a redundant word line and method for testing the memory chip, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
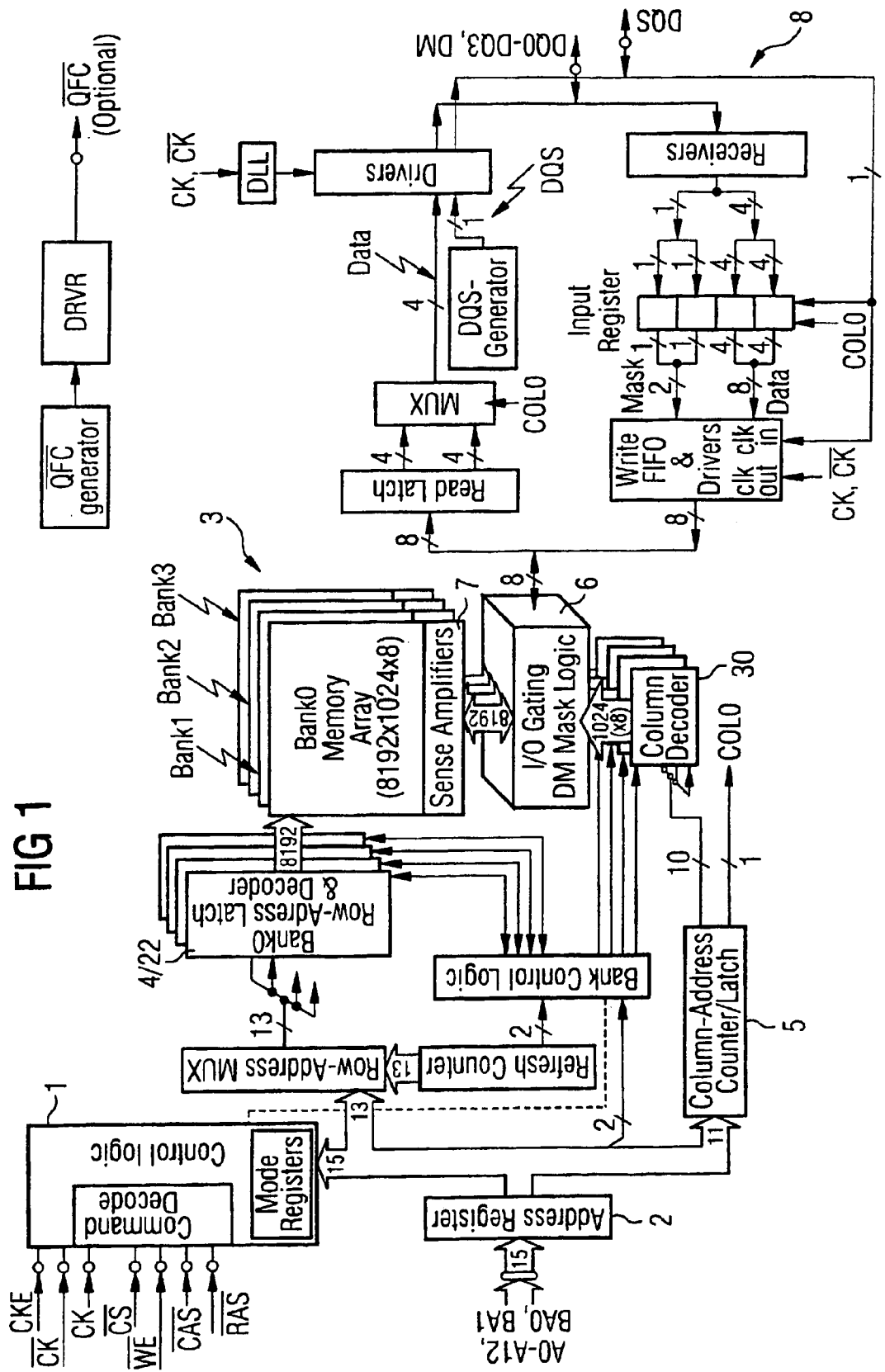
FIG. 1 is a block circuit diagram of a DRAM memory configuration according to the invention.

Referring now to the figures of the drawings in detail and first, particularly to FIG. 1 thereof, there is shown a diagrammatic representation of a DRAM memory chip with a control unit 1, an address register 2, a word address memory/decoder 4, a column address memory/decoder 5, an input/output circuit 6, an amplifier circuit 7, and a data input/output 8. The address of the memory cell into which a data item is to be written or from which a data item is to be read out is supplied to the address register 2. The address is, then, split into a word line address and a column address and the word line address is supplied to the word address memory/decoder 4 and a column address is supplied to the column address memory/decoder 5. Following this, a word line is selected by the word address memory/decoder based upon the address supplied, and is activated by applying a high level. As a result, all memory cells that are connected to a word line are conductively connected to the associated bit lines through a transistor. The charges deposited in the memory cells of the activated word line are, thus, transferred to the associated bit lines. The bit lines are connected to the amplifier circuit 7 and the amplifier circuit 7 amplifies the voltages delivered to the bit lines. Thus, amplified voltages are present at the bit lines selected through the activated word line. Using the column address supplied, the column address memory/decoder 5 activates a fixed amplifier circuit that forwards the charge of the memory cell corresponding to the column address through the input/output circuit 6. The input/output circuit 6 delivers the data item delivered by the amplifier circuit 7 through the data input/output 8.

Reading a data item into a selected memory cell is done in the reverse order so that the data item is supplied through the data input/output 8 and is written onto a bit line through the input/output circuit 6 of an amplifier circuit specified by the column address memory/decoder 5. At the same time, the word line belonging to the memory cell to be addressed is activated through the word address memory/decoder 4. As a result, the voltage received by the bit line is written as a charge into the memory cell addressed.

Figure 2:
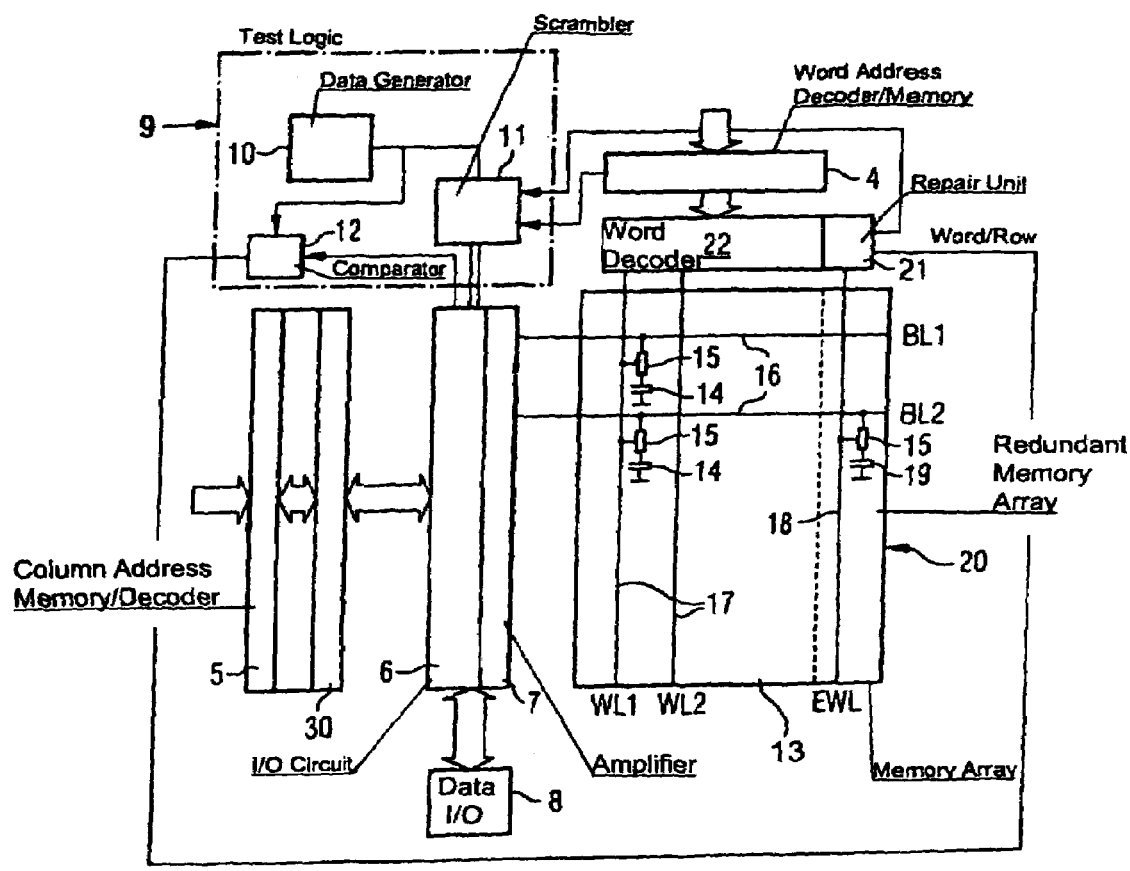
FIG. 2 is a block and schematic circuit diagram of a part of the circuit DRAM memory configuration of FIG. 1.

FIG. 2 shows a more detailed representation of a partial section of the DRAM memory chip of FIG. 1.

A test logic 9 that has a data generator 10, a scrambler unit 11, and a comparator unit 12 as shown in FIG. 2 is provided for a test of the memory cells. The data generator 10, the scrambler unit 11, and the comparator unit 12 are integrated in the memory chip, especially, the DRAM memory. A memory array 13 is shown having a multiplicity of memory cells 14. The memory cells 14 are connected to a bit line 16 through in each case one transistor 15. In addition, rows of transistors 15 are connected respectively with control connections to a word line 17. Furthermore, a redundant memory array 20 is provided in which redundant memory cells 19 are disposed. Corresponding to the regular memory cells, the redundant memory cells 19 can be connected to bit lines 16 through transistors 15. The control connections of the transistors 15 of the redundant memory cells 19 are connected to redundant word lines 18. The redundant word lines 18 are connected to a repair unit 21. The repair unit 21 is connected to the word address decoder/memory 4. The data generator 10 is connected to a data input of the scrambler unit 11. The scrambler unit 11 is connected to a data input of the input/output circuit 6. In addition, the scrambler unit 11 has an address connection to the word address memory/decoder 4 and a line connection to the repair unit 21. The line connection can be constructed as address connection or can also be used only for transmitting a digital data item, depending on the application.

To test the operability of the memory cells 14 and of the redundant memory cells 19, the data generator 10 delivers data patterns to the scrambler unit 11 that are written into the memory cells 14 and redundant memory cells 19 by the scrambler unit 11 through the input/output circuit 6 and the amplifier circuit 7. After that, the data patterns written in are read out again from the memory cells 14 and the redundant memory cells 19 and are output through the amplifier circuit 7 and the input/output circuit 6 to the comparator unit 12. The comparator unit 12 compares whether the data patterns written in correspond to the data patterns read out. For such a purpose, the comparator unit 12 is also connected to the data generator 10 and, thus, knows the data patterns written into the memory cells 14 and the redundant memory cells 19.

If the comparator unit 12 detects that the data patterns written in correspond to the data patterns read out, correct operability of the memory cells 14 and of the redundant memory cells 19 is detected. If, however, deviations between the data pattern written in and the data pattern read out are obtained during the comparison, the comparator unit 12 detects that certain memory cells 14 or certain redundant memory cells 19 are not operating correctly. If a memory cell is detected as not correctly operable, this information is driven to the outside through data lines as an error. Repairs can, then, be effected through E-fuses or laser fuses. The repair unit 21, then, replaces a defective memory cell 14 or a defective redundant memory cell 19 with a redundant memory cell 19. The defective memory cell is replaced such that the address of the defective memory cell is deposited in the repair unit 21. If the word address memory/decoder 4 delivers an address of a defective memory cell to the repair unit 21, the repair unit 21 recognizes the identity between the memory cell to be activated and the stored error address. The repair unit 21, then, activates the redundant memory cell 19 provided for the defective memory cell and, at the same time, blocks the activation of the word address decoder 4 by an enable signal. Instead of the intended word line, a redundant word line 18 is, thus, activated.

Figure 3:
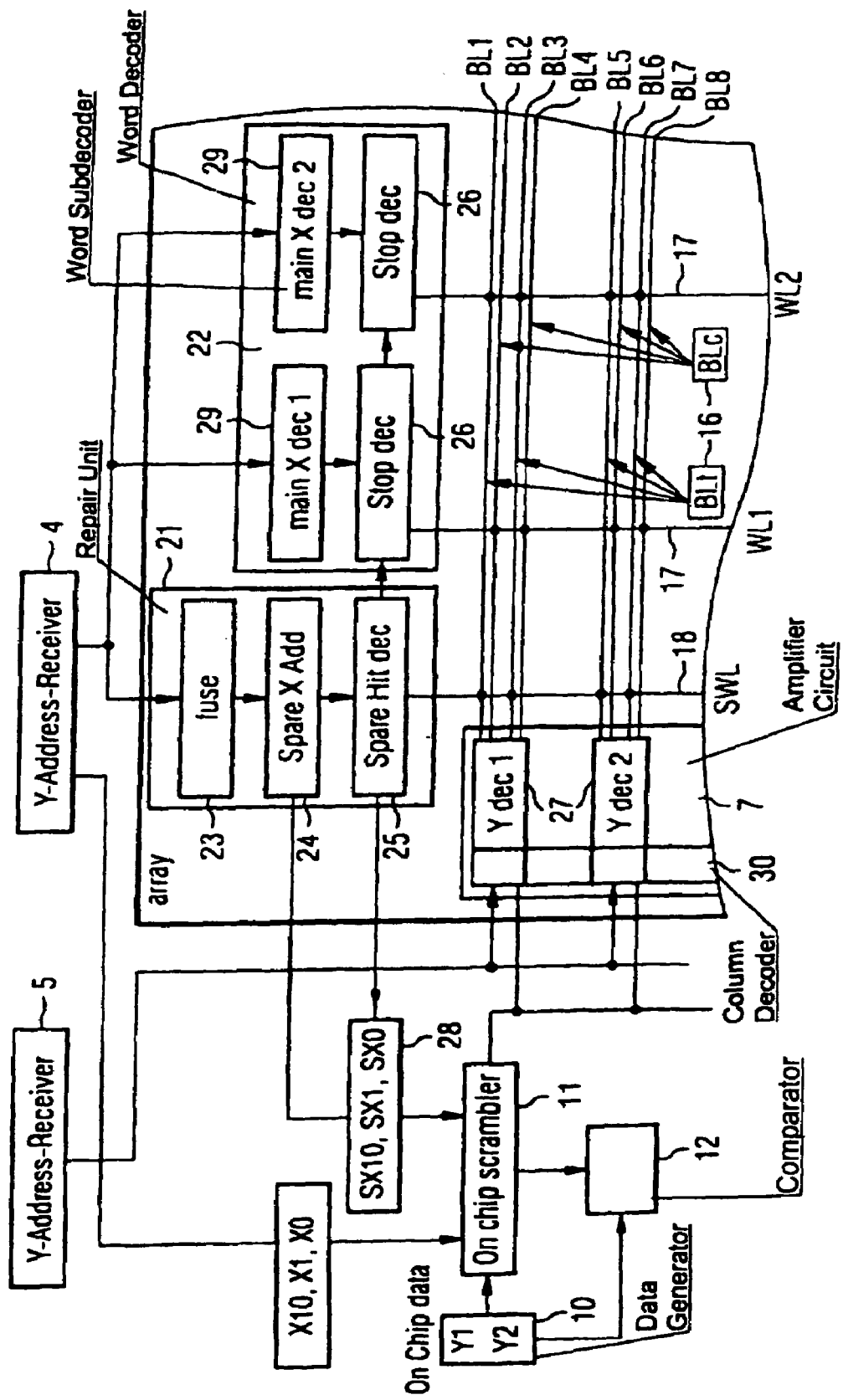
FIG. 3 is a fragmentary, block circuit diagram of a more detailed representation of the test logic and of the memory array of FIGS. 1 and 2 with bit line pairs.

FIG. 3 shows the structure of the amplifier circuit 7, of the repair unit 21, and of the configuration of the bit lines 16 in a detailed representation. In this embodiment, the amplifier circuit 7 has a number of amplifier subcircuits 27. The amplifier subcircuits 27 are connected to the column decoder 30 that is connected to the column address memory 5. Each amplifier subcircuit 27 is connected to two bit line pairs, each bit line pair having a true bit line Blt and a complementary bit line Blc. During the evaluation of the memory status of the memory cells 14, 19, the amplifier subcircuit 27 in each case compares the potential difference between the bit line that is connected to the memory cell that is to be read out and the bit line that belongs to the bit line pair of the bit line of the memory cell to be read out. The amplifier subcircuit 27 outputs a logical one whenever the voltage level of the true bit line is greater than the voltage level of the complementary bit line. This leads to a logical one of a memory cell that is connected to a true bit line being represented by a physical high level of the memory cell. Correspondingly, a logical zero is represented by a low level of the memory cell that is connected to a true bit line. In contrast, the logical one is represented by a physical low level in a memory cell that is connected to a complementary bit line. Correspondingly, a logical zero is represented by a physical low level of the memory cell that is connected to a complementary bit line.

In the example, the word lines 17 are always connected either to true bit lines or to complementary bit lines of a number of bit line pairs. Correspondingly, the redundant word lines 18 are also connected either to true bit lines or to complementary bit lines of a number of bit line pairs. During a repair of a defective word line 17 by a redundant word line 18, it can, thus, happen that a word line 17 that is only connected to complementary bit lines is replaced by a redundant word line 18 that is only connected to true bit lines. For reliable testing of the memory cell during a test process, however, this leads to the memory cells having to be loaded not with a logical zero as hitherto, i.e., with a high level in the case of a memory cell of a complementary bit line, but with a logical one, i.e., with a physical high level in the case of a memory cell that is connected to a true bit line. To avoid these problems, the word address of the redundant word line 18 is conveyed to the scrambler unit 11, according to the invention. During the test procedure to be performed, the scrambler unit 11 takes into consideration whether the redundant word line is a word line that can be connected to memory cells by true bit lines or by complementary bit lines.

As such, a simplification of the test process can be achieved because, for a reliable test of the memory cells and of the redundant memory cells 19, the scrambler unit 11 in each case loads the memory cells 14 and the redundant memory cells 19 with the physical level that is correct for the test. When retention is tested, e.g., the physical high level is critical. For this reason, this charge state, in particular, must be precisely tested. Due to the method according to the invention, it is no longer necessary, as previously in the prior art, to write, and to read out again, both a logical zero and a logical one to/from the memory cells in order to ensure that a physical high level has been written into the memory cell, read out, and checked at least once.

The repair unit 21 according to the invention has a fuse circuit 23 that is connected to the word address memory 4. The fuse circuit 23 is followed by a spare address memory 24 that is connected to a buffer 28. The buffer 28 is connected to the scrambler unit 11. Furthermore, the spare address memory 24 is followed by a hit circuit 25 that, in turn, is connected to the redundant word line 18.

The word decoder 22 has word subdecoders 29 that in each case are allocated to a word line 17. The word subdecoders 29 are connected to the word address memory 4. The word subdecoder 29 is followed by a stop circuit 26. The stop circuit 26 is connected to a word line 17.

If, then, a test procedure is performed after the repair, the control unit 1 activates the data generator 10. The data generator 10, then, forwards a fixed data pattern to the scrambler unit 11. The scrambler unit 11 receives from the word address memory 4 the word address regularly specified. From the regular word address, the scrambler unit 11 recognizes whether the word line to be activated is connected to complementary bit lines or to true bit lines. If the word line to be activated is connected to true bit lines, logical ones are forwarded to the amplifier circuit 7 to be written in for checking the memory cells. For such a purpose, the scrambler unit 11 delivers a logical one signal to the amplifier circuit 7 through the output line. From the column address specified by the column address memory 5, one of the amplifier subcircuits 27 is selected. In this exemplary embodiment, two data items are in each case output to in each case one bit line of the two bit line pairs connected to the selected amplifier subcircuit 27 and are, thus, written into the corresponding memory cells. If, for example, the top amplifier subcircuit $Y_{dec}1$ is selected by the column address and the right-hand word line WL2 is selected through the word address, the scrambler unit 11 supplies two logical ones for testing because the word line WL2 is connected to true bit lines. If the word address memory/decoder 4 specifies word line WL1, the scrambler unit 11 supplies two logical zeros as data items that are written in with physical high levels.

If, then, the word address memory 4 supplies a word address that belongs to a word line detected as being defective, the condition is recognized by the repair unit 21. The repair unit 21 has the addresses of the defective word lines in the fuse circuit 23. If a word address supplied by the word address memory 4 corresponds to a word address deposited in the fuse circuit 23, an address of a defective word line is recognized. If the fuse circuit 23 detects a defective word line, the fuse circuit 23 forwards a control signal to the spare address memory 24. The spare address memory 24 forwards the bits, needed for correct scrambling, of the word address of the redundant word line 18 addressed for the defective word line to the buffer 28. After that, the spare address memory 24 forwards a control signal to the hit circuit 25. After receiving a control signal, the hit circuit 25 activates the buffer 28. After receiving the activation signal, the buffer 28 delivers the address of the redundant word line 18 used for repairing the defective word line, stored in the buffer 28, to the scrambler unit 11. In addition, the hit circuit 25 activates the redundant word line 18. Moreover, the hit circuit 25 delivers a stop signal to the stop circuits 26 of the word decoder 22. After receiving the stop signal, activation of a word line 17 by the word decoder 22 is stopped.

If the scrambler unit 11 is supplied with a word address from the buffer 28, the scrambler unit 11 takes into consideration the word address when driving the amplifier circuit 7. The scrambler unit 11, then, takes into consideration whether the redundant word line that is activated is connected to true bit lines or complementary bit lines. If the redundant word line 18 is connected to true bit lines, a critical state of the memory cells connected to the redundant word line is checked by writing a logical one and a physical high level into the memory cells. If, however, the redundant word line 18 is connected to complementary bit lines, a critical state of the memory cells that can be activated by the redundant word line 18 is checked by writing in a logical zero and, thus, also by writing in a physical high level. The information as to whether the redundant word line is connected to complementary bit lines or to true bit lines can be seen from the word address.

In a simplified embodiment, the repair unit 21 does not inform the scrambler unit 11 of the address of the word line to be activated redundantly but only of the type of word line that is activated, for example, a word line that is only connected to true bit lines. This information is contained in a few address bits. As such, the information as to whether the word line to be activated redundantly is connected to true bit lines or to complementary bit lines is already evaluated in the repair unit 21. Such a configuration provides for a simple construction of the scrambler unit 11.

For performing the test procedures, it is often required for testing a memory cell to apply a defined voltage potential to the other memory cells disposed around the memory cell. It is, thus, advantageous for performing the test procedures to know the actual physical voltage state, and/or to set a required voltage state, for the memory cells that are activated by the redundant word line 18. However, this requires the information as to whether the redundant word line 18 is connected to true bit lines or to complementary bit lines. According to the invention, such information is provided to the scrambler unit 11 in the proposed memory chip even after a defective word line has been repaired by a redundant word line so that it is, correspondingly, taken into consideration during the performance of the test procedure.

The invention has been explained with the example of redundant word lines but can be applied to any data line, especially, to the bit lines.

I claim:

1. A memory chip, comprising:
   memory cells having word lines, spare word lines, and bit lines;
   a data generator;

a test logic connected to said data generator and to said memory cells for writing test data into and reading test data out from said memory cells;

a first address register for supplying a first address for a selection of one of said word lines;

a second address register for supplying a second address for a selection of one of said bit lines;

a first selection decoder connected to said first address register, said first selection decoder activating a word line dependent upon said first address provided by said first address register;

a plurality of switches having control inputs connected to said word lines, each of said switches being connected between a respective one of said memory cells and one of said bit lines, said switches being connected to said word line being switched to conduct with an activation of said word line;

respective sets of two of said bit lines being combined to form one bit line pair, a first bit line of said bit line pair being a true bit line and a second bit line of said bit line pair being a complementary bit line;

amplifier circuits, a respective one of said amplifier circuits being connected to a respective one of said bit line pairs;

a second selection decoder connecting said test logic to said amplifier circuits, said second selection decoder being connected to said second address register for selecting said bit line pair;

said test logic being connected to said first selection decoder, said test logic writing into one of said memory cells connected to a complementary one of said bit lines a logical data item having a different physical value than a data item written into another of said memory cells connected to said true bit line;

a repair unit being connected to said test logic and having an address register storing addresses therein at least of said spare word lines, said repair unit being connected to said first selection decoder and diverting, through a readdressing of an access of said first selection decoder to a defective one of said word lines, to one of the addresses, stored in said address register, of a spare one of said spare word lines; and said test logic taking into consideration an address of said spare word line during the writing and reading of the test data in the presence of a readdressing to one of said spare word lines, said address of said spare word line having information regarding connection of said spare word line to one of said true bit line and said complementary bit line.

2. A method for testing memory cells of a memory chip having word lines, spare word lines, and bit lines, which comprises:

providing a test logic for writing in test data to the memory cells and reading out test data from the memory cells with a first address register supplying a first address for selecting a word line;

supplying a second address for selecting a bit line with a second address register;

connecting a first selection decoder to the first address register;

connecting the test logic to the first selection decoder;

activating a word line through the first selection decoder dependent upon the first address of the first address register;

connecting a word line to at least one control input of a plurality of switches;

connecting a switch between each of the memory cells and each of the bit lines;

switching at least one switch connected to a word line to conduct with an activation of the word line;

combining two types of the bit lines to form respective bit line pairs;

connecting a respective bit line pair to a respective amplifier circuit, a first bit line of the bit line pair being a true bit line and a second bit line of the bit line pair being a complementary bit line;

during the reading out of a data item, comparing potentials of the true bit line and the complementary bit line of a bit line pair with the amplifier circuit, recognizing a logical one with the amplifier circuit if a potential of the true bit line is greater than a potential of the complementary bit line and recognizing a logical zero with the amplifier circuit if the potential of the true bit line is less than the potential of the complementary bit line;

connecting the test logic to the amplifier circuits through a second selection decoder;

selecting an amplifier circuit by connecting the second selection decoder to the second address register;

with the test logic, writing into a memory cell connected to a complementary bit line a data item having a different physical value than a data item written into a memory cell connected to a true bit line;

providing a repair unit with an address register for storing addresses and connecting the repair unit to the test logic;

readdressing an access of the first selection decoder to a defective word line by the repair unit diverting the access to an address of a spare word line deposited in the address register;

taking into consideration the address of the spare word line with the test logic in the presence of a readdressing to a spare word line, the address of the spare word line exhibiting information on whether the spare word line is a true bit line or a complementary bit line;

only writing data corresponding to a high level into the memory cells with the test logic; and recognizing a correct operability of the memory cells by reading out the memory cells again and comparing the data read out with the data written therein.

* * * * *